United States Patent
Tsunoda

(10) Patent No.: US 8,289,196 B2
(45) Date of Patent: Oct. 16, 2012

(54) PARALLEL-SERIAL CONVERTER

(75) Inventor: Yukito Tsunoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 153 days.

(21) Appl. No.: 12/985,782

(22) Filed: Jan. 6, 2011

(65) Prior Publication Data

US 2011/0181451 A1 Jul. 28, 2011

(30) Foreign Application Priority Data

Jan. 26, 2010 (JP) ................................. 2010-014755

(51) Int. Cl.
*H03M 9/00* (2006.01)
*H04L 7/00* (2006.01)
(52) U.S. Cl. ......................... 341/101; 375/355; 375/374
(58) Field of Classification Search .................. 341/101; 375/355, 362, 374, 375, 376
See application file for complete search history.

(56) References Cited

U.S. PATENT DOCUMENTS

| | | | | |
|---|---|---|---|---|
| 5,533,072 A | * | 7/1996 | Georgiou et al. | 375/371 |
| 7,142,623 B2 | * | 11/2006 | Sorna | 375/376 |
| 7,990,294 B2 | * | 8/2011 | Doi et al. | 341/101 |
| 8,199,036 B2 | * | 6/2012 | Sugawara et al. | 341/101 |

FOREIGN PATENT DOCUMENTS

JP 2000-196462 A 7/2000

OTHER PUBLICATIONS

Kanda, K. et al., A Single-40 Gb/s Dual-20 Gb/s Serializer IC With SFI-5.2 Interface in 65 nm CMOS, IEEE Journal of Solid-State Circuits, vol. 44, No. 12, Dec. 2009, pp. 3580-3589.*

Kanda, Kouichi et al., "A Single-40Gb/s Dual-20Gb/s Serializer IC with SFI5.2 Interface in 65nm CMOS",ISSCC 2009 / Session 21 / 10Gb/s-TO-40Gb/s Transmitters and Receivers/ 21.2, Feb. 11, 2009, pp. 360-362, IEEE.

* cited by examiner

*Primary Examiner* — Howard Williams
(74) *Attorney, Agent, or Firm* — Fujitsu Patent Center

(57) ABSTRACT

A parallel-serial converter includes a converter circuit that converts parallel data into serial data; a first sampling circuit that samples, according to a first clock signal, the serial data output from the converter circuit; a second sampling circuit that samples, according to a second clock signal that is an inverse of the first clock signal, replica data that is synchronized with the serial data; a third sampling circuit that samples, according to plural third signals respectively having different phases, output from the second sampling circuit; and a control circuit that controls sampling timing of the first sampling circuit, based on each output from the third sampling circuit.

5 Claims, 12 Drawing Sheets

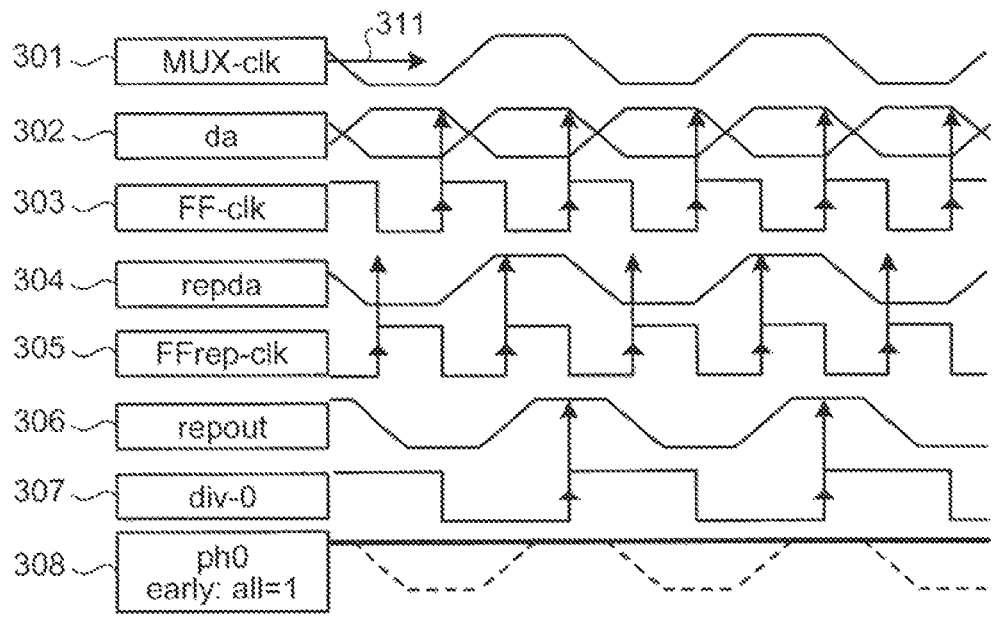
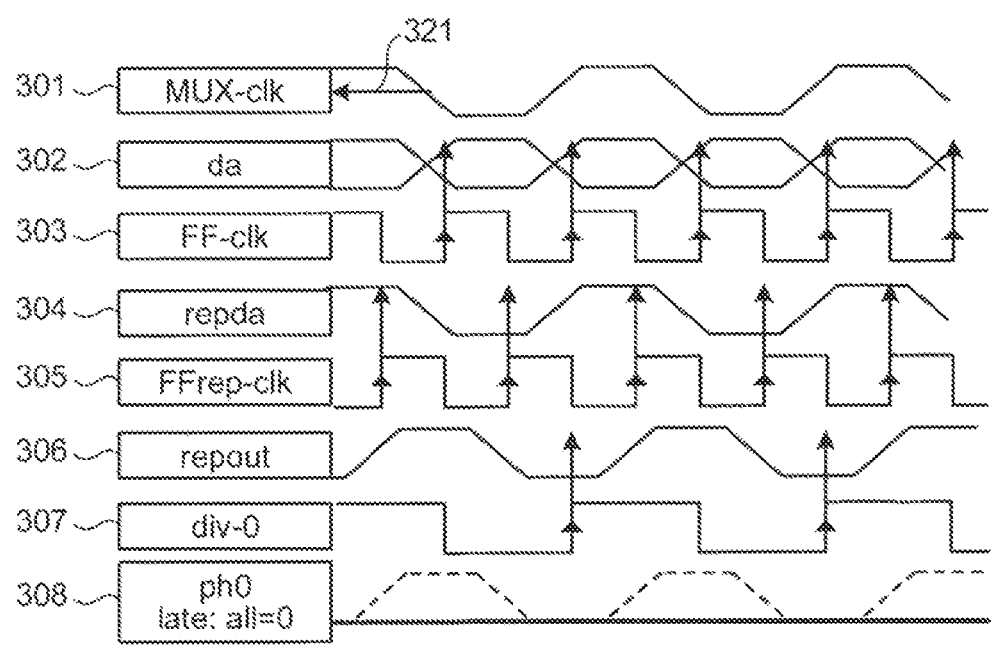

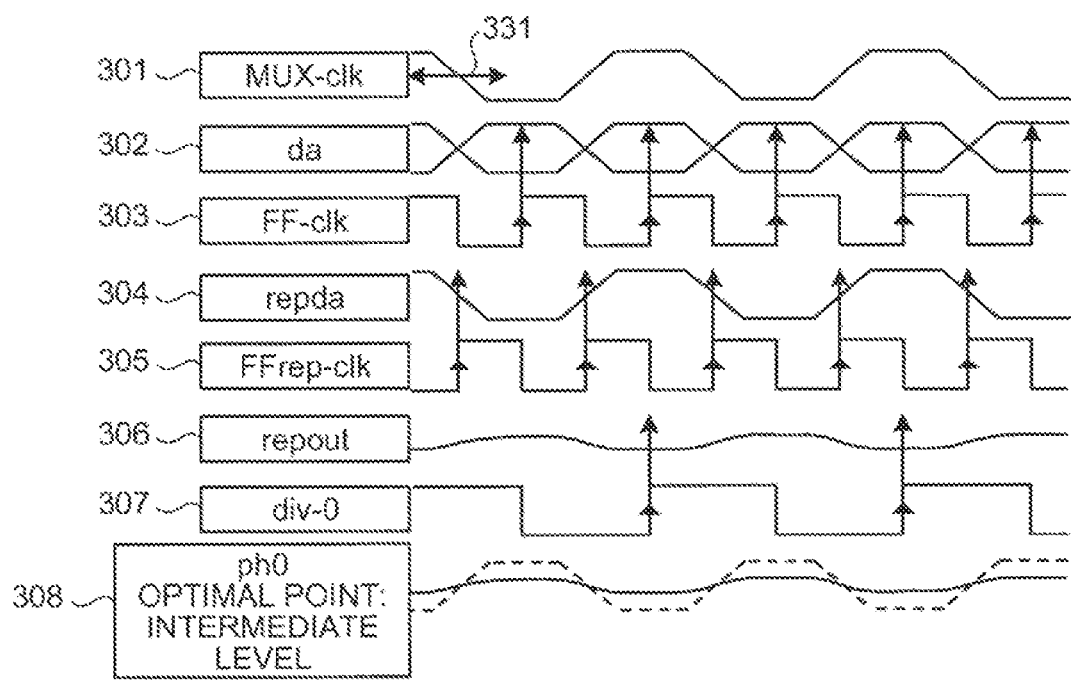

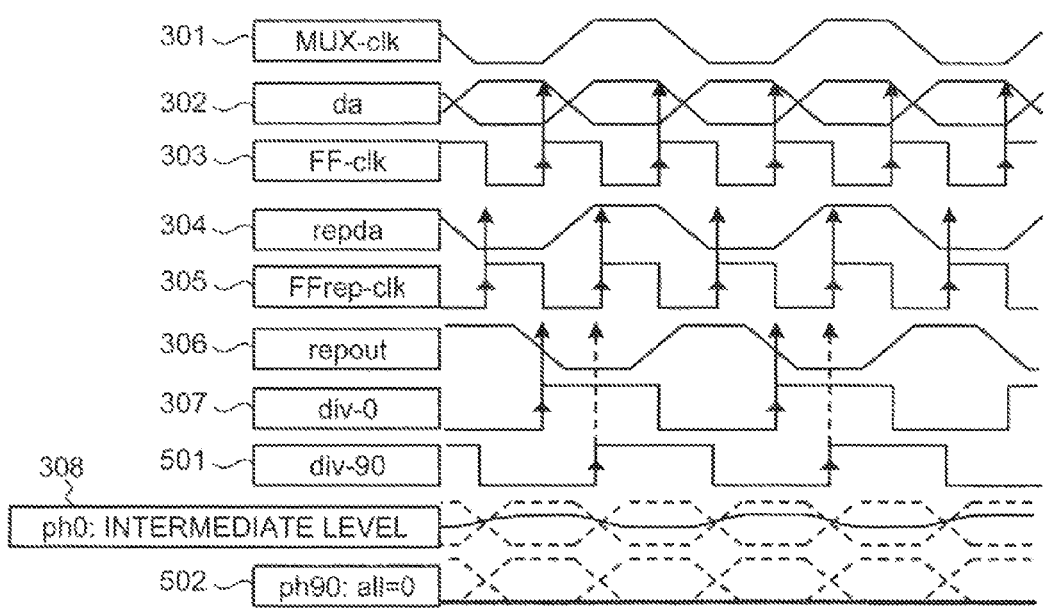
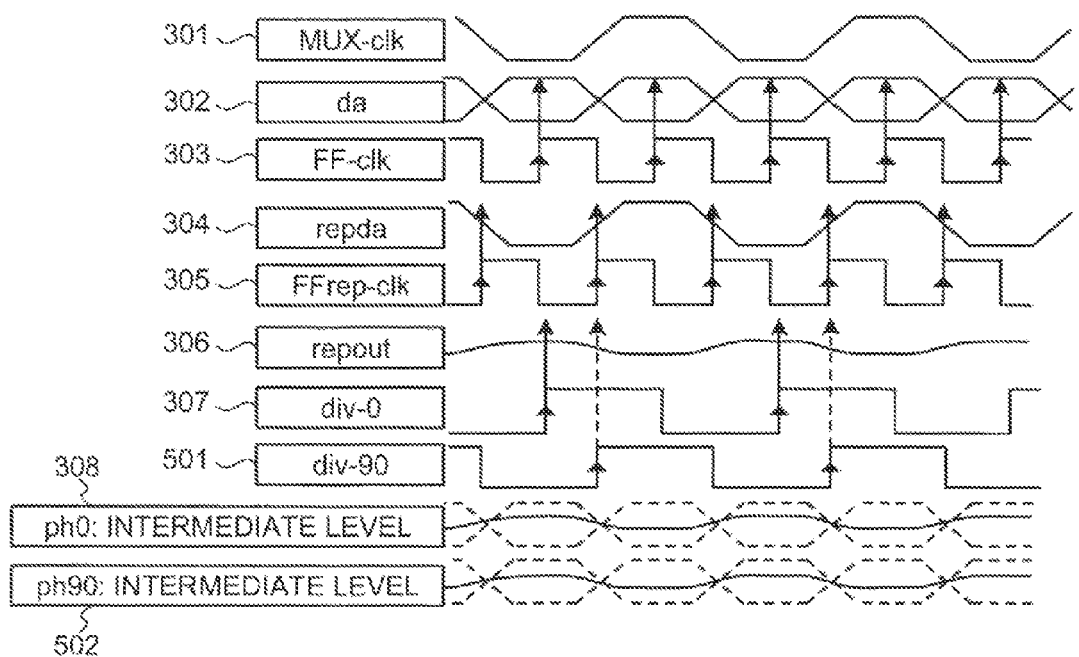

FIG.9

| ph0 | ph90 | ph0 ud enable | ph0 up | ph0 down | ph90 ud enable | ph90 up | ph90 down | ph90 ud enable2 | code up-down |
|---|---|---|---|---|---|---|---|---|---|
| LOW | LOW | 1 | 0 | 1 | 1 | 0 | 1 | 0 | DOWN |
| LOW | HIGH | 1 | 0 | 1 | 1 | 1 | 0 | 0 | DOWN |
| LOW | INTER-MEDIATE LEVEL | 1 | 0 | 1 | 0 | OFF | OFF | 0 | DOWN |
| HIGH | LOW | 1 | 1 | 0 | 1 | 0 | 1 | 0 | UP |
| HIGH | HIGH | 1 | 1 | 0 | 1 | 1 | 0 | 0 | UP |
| HIGH | INTER-MEDIATE LEVEL | 1 | 1 | 0 | 0 | OFF | OFF | 0 | UP |
| INTER-MEDIATE LEVEL | LOW | 0 | OFF | OFF | 1 | 0 | 1 | 1 | DOWN |
| INTER-MEDIATE LEVEL | HIGH | 0 | OFF | OFF | 1 | 1 | 0 | 1 | UP |
| INTER-MEDIATE LEVEL | INTER-MEDIATE LEVEL | 0 | OFF | OFF | 0 | OFF | OFF | 1 | OPTIMALLY FIXED |

FIG.10
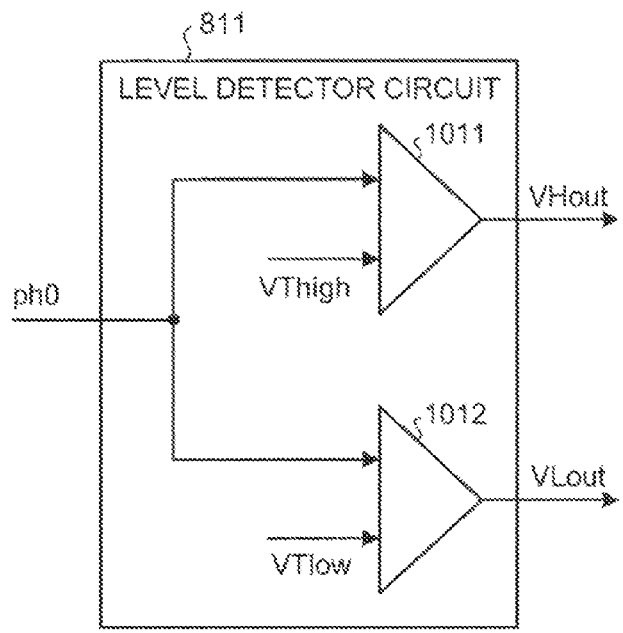
FIG.11
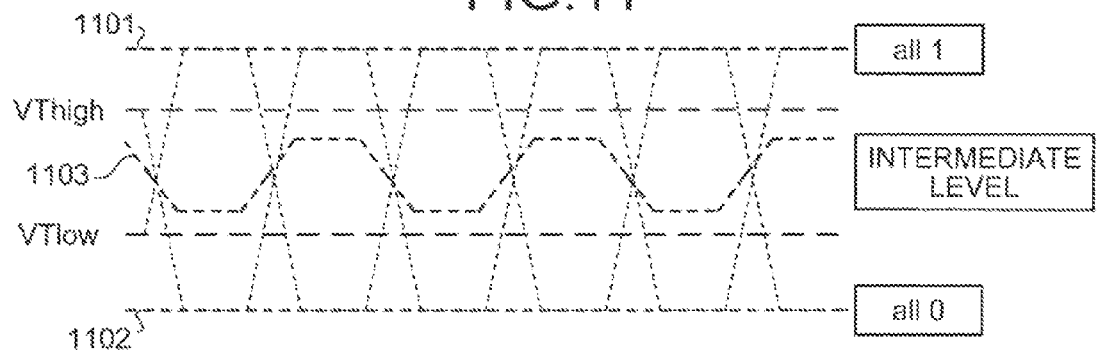
FIG.12
| VHout | VLout | LEVEL |
|---|---|---|
| HIGH | HIGH | HIGH |
| LOW | HIGH | INTERMEDIATE LEVEL |
| LOW | LOW | LOW |

PARALLEL-SERIAL CONVERTER

CROSS REFERENCE TO RELATED APPLICATIONS

This application is based upon and claims the benefit of priority of the prior Japanese Patent Application No. 2010-014755, filed on Jan. 26, 2010, the entire contents of which are incorporated herein by reference.

FIELD

The embodiments discussed herein are related to a parallel-serial converter that converts parallel data into serial data.

BACKGROUND

Advances in the speed at which data is communicated have progressed in recent years accompanying increases in the amount of data communicated in the field of communication. High-speed transmission data, for example, is generated from low-speed parallel data, using parallel-serial converters. Using setups, holds, etc. by latches, flip flops, etc. driven by clock signals, parallel-serial converters adjust the input timing of data.

Similarly, for example, Japanese Laid-Open Patent Publication No. 2000-196462 recites conversion into a single string of serial data according to a sequence established by a selector driven by a clock signal. Technology is then used that retimes and shapes the waveform of the serial data by sampling the converted serial data by a flip flop that operates based on a clock signal. In this circuit, as the data speed increases, the timing margin for operating latches, flip flops, selectors retiming flip flops, etc. narrows, making the parallel-serial converter susceptible to the effects of fluctuations.

With the conventional technologies above, since accurately detecting phase deviations between converted serial data and the clock signal is difficult, a problem arises in that shaping of the serial data cannot be performed with a high degree of accuracy. For example, if the rising edge of the clock signal deviates from the optimal point of the serial data and the serial data is sampled near the switching point, the serial data that is shaped deteriorates.

As a means of solving the problem above, technology is used that involves forming a replica circuit synchronized with serial data to detect the phase state thereof and executes control such that the phase state of serial data and retiming clock becomes optimal by adjusting the phase based on data obtained from the detection (see, for example, "A Single-40 Gb/s Dual-20 Gb/s Serializer IC with SFI5.2 Interface in 65 nm CMOS", ISSCC 2009/SESSION 21, [retrieved 2010 Jan. 26] <URL:http://www.techonline.com/learning/techpaper/213403974>).

Nonetheless, with the conventional art above, when the phase state of the replica data above is detected, sampling is performed based on a clock that is the inverse of the retiming clock and since a clock having a cycle of an even multiple of the inverse clock is used for sampling to perform detection, irrespective of the phases not being at the optimal point, detection results indicate a state identical to that for the optimal point (metastable condition) because of the phase relationship between the sampling output for the inverse clock and the clock having the cycle that is an even multiple of the inverse clock.

SUMMARY

According to an aspect of an embodiment, a parallel-serial converter includes a converter circuit that converts parallel data into serial data; a first sampling circuit that samples, according to a first clock signal, the serial data output from the converter circuit; a second sampling circuit that samples, according to a second clock signal that is an inverse of the first clock signal, replica data that is synchronized with the serial data; a third sampling circuit that samples, according to plural third signals respectively having different phases, output from the second sampling circuit; and a control circuit that controls sampling timing of the first sampling circuit, based on each output from the third sampling circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3A is a timing chart for a case where the phase of a clock signal is delayed relative to serial data.

FIG. 3B is a timing chart for a case where the phase of the clock signal is early relative to the serial data.

FIG. 3C is a timing chart for a case where with respect to the serial data, the phase of the clock signal coincides with an optimal point.

FIG. 5A is a first diagram depicting how errant determination is prevented by the clock signals having different phases.

FIG. 5B is a second diagram depicting how errant determination is prevented by the clock signals having different phases.

FIG. 9 depicts operation of the counter circuit depicted in FIG. 8.

FIG. 10 depicts an example of a level detector circuit depicted in FIG. 9.

FIG. 11 depicts an example of setting a threshold of the level detector circuit depicted in FIG. 10.

FIG. 12 depicts an example of level determination by the level detector circuit depicted in FIG. 10.

DESCRIPTION OF EMBODIMENTS

Preferred embodiments of the present invention will be explained with reference to the accompanying drawings. A parallel-serial converter disclosed herein prevents errant determination of a non-optimal point as the optimal point and shapes serial data with a high degree of accuracy by sampling, according to multiple clock signals of different phases, the sampling results of replica data synchronized with serial data.

Figure 1:
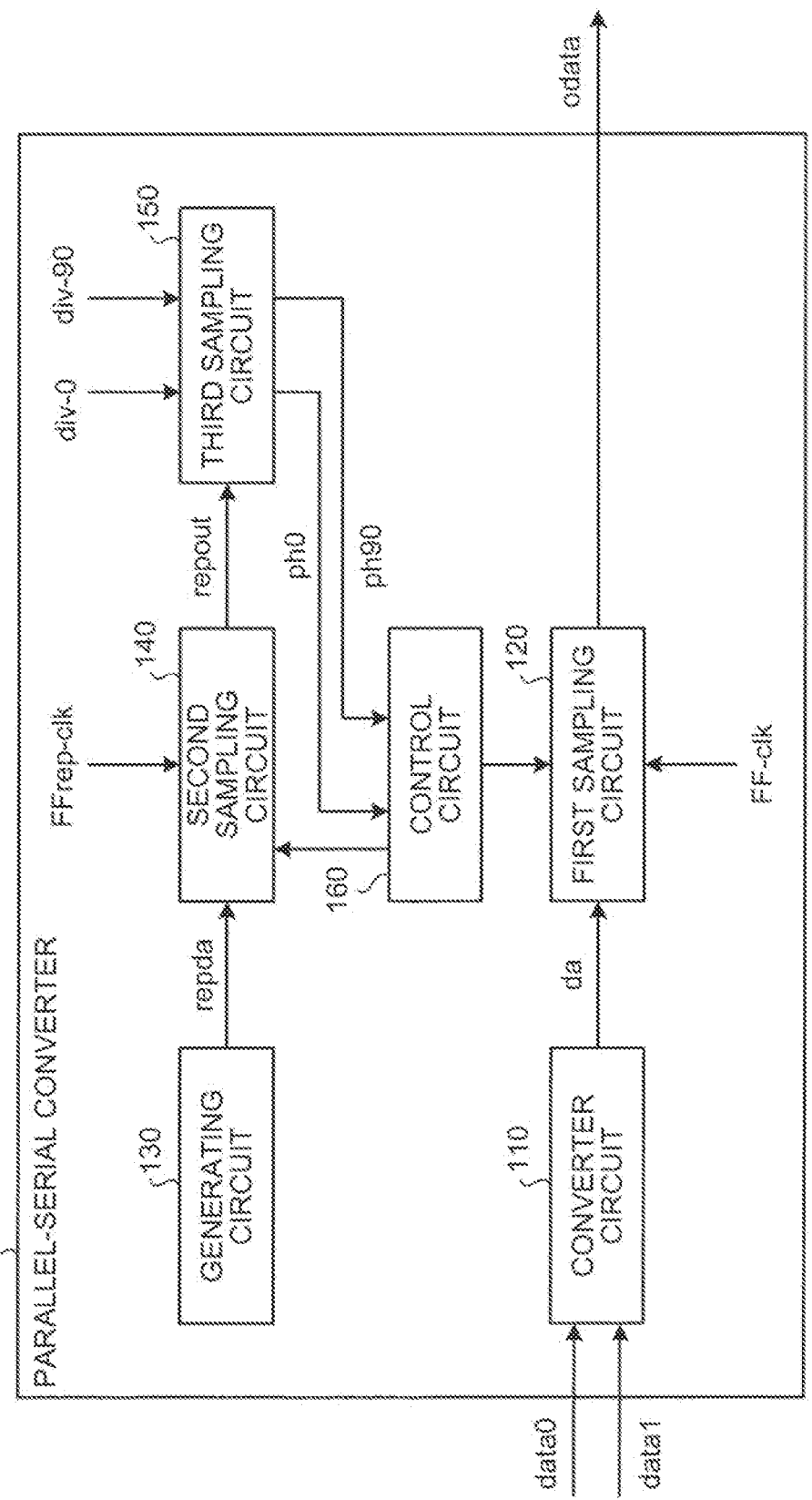
FIG. 1 depicts a parallel-serial converter according to a first embodiment.

FIG. 1 depicts a parallel-serial converter according to a first embodiment. As depicted in FIG. 1, a parallel-serial converter 100 includes a converter circuit 110, a first sampling circuit 120, a generating circuit 130, a second sampling circuit 140, a third sampling circuit 150, and a control circuit 160.

The converter circuit 110 converts data0, data1, input as parallel data, into serial data da. For example, the converter circuit 110 alternately selects and outputs data0 and data1, thereby converting data0 and data1 into serial data da. The converter circuit 110 outputs the serial data da to the first sampling circuit 120.

The first sampling circuit 120 performs retiming and waveform shaping by sampling, according to a clock signal FF-clk (first clock signal), the serial data da output from the converter circuit 110. For example, the first sampling circuit 120 samples the serial data da at the rising edge of the clock signal FF-clk. The first sampling circuit 120 outputs downstream, data_odata obtained from the sampling.

The generating circuit 130 generates replica data_repda synchronized with the serial data da. Specifically, the generating circuit 130 generates the replica data_repda to be of a fixed pattern (e.g., alternating 0's and 1's) synchronized with the serial data da. The generating circuit 130 outputs the generated replica data_repda to the second sampling circuit 140.

The second sampling circuit 140, based on a clock signal FFrep-clk (second clock signal), samples the replica data_repda output from the generating circuit 130. The clock signal FFrep-clk is an inverse signal of the clock signal FF-clk. For example, the second sampling circuit 140 samples the replica data_repda at the rising edge of the clock signal FFrep-clk. Further, the second sampling circuit 140 outputs sampling results as output_repout, to the third sampling circuit.

The third sampling circuit 150, based on clock signals (third clock signals) of different phases, samples the output_repout from the second sampling circuit 140. For example, the third sampling circuit 150 samples the output_repout at the rising edge of clock signals div-0 and div-90 input thereto.

The clock signals div-0 and div-90, for example, have a phase difference of 90 degrees. The cycle of the clock signals div-0 and div-90 is, for example, an even multiple of the cycle of the clock signal FF-clk. The third sampling circuit 150 outputs to the control circuit 160 and as output_ph0, results of the sampling of the output_repout according to the clock signal div-0. Further, the third sampling circuit 150 outputs to the control circuit 160 and as output_ph90, results of the sampling of the output_repout according to the clock signal div-90.

The control circuit 160, based on the output (output_ph0, output_ph90) from the third sampling circuit 150, controls the timing relationship of the serial data and the sampling clock in the first sampling circuit 120. For example, the control circuit 160 controls the sampling timing of the first sampling circuit 120 by changing the phase of the serial data da input to first sampling circuit 120 and the phase of the replica data_repda synchronized with the serial data da. Alternatively, the control circuit 160 may control the sampling timing of the first sampling circuit 120 by changing the phase of the clock signal FF-clk input to the first sampling circuit 120 as well as the phase of the clock signal FFrep-clk input to the second sampling circuit 140 and synchronized with the phase of the clock signal FF-clk.

In the configuration above, sampling of the output_repout by the third sampling circuit 150 enables detection of deviation in the rising edge of the clock signal FFrep-clk with respect to the switching point of the replica data_repda. For example, if there is no deviation in the phase of the clock signal FFrep-clk with respect to the switching point of the replica data_repda, sampling results of the third sampling circuit 150 are indeterminate. Specifically, the sampling results of the third sampling circuit 150 is an intermediate level between a high level (e.g., "1") and a low level (e.g., "0") of the replica data_repda.

Further, if there is phase deviation of the clock signal FFrep-clk with respect to the switching point of the replica data_repda, sampling results of the third sampling circuit 150 become constant. Specifically, sampling results of the third sampling circuit 150 is replica data_repda are constant at the high level or the low level. Further, according to the direction of the phase deviation of the clock signal FFrep-clk with respect to the switching point of the replica data_repda, the output level of the sampling results of the third sampling circuit 150 differs.

The replica data_repda is synchronized with the serial data da; and the clock signal FFrep-clk is the inverse signal of the clock signal FF-clk. Consequently, the phase deviation of the clock signal FFrep-clk with respect to the switching point of the replica data_repda indicates the rising edge of the phase deviation of the clock signal FF-clk with respect to the optimal point of the serial data da in the first sampling circuit 120.

The optimal point of the serial data da is, for example, a central point between switching points of the serial data da. Therefore, sampling of the output_repout by the third sampling circuit 150 enables detection of a deviation of the phase of the clock signal FF-clk with respect to the optimal point of the serial data da in the first sampling circuit 120.

Here, a case will be explained where there is phase deviation of the clock signal FFrep-clk with respect to the switching point of the replica data_repda and the output_repout is a signal reiterating high and low levels. In this case, the rising edge of the clock signal in the third sampling circuit 150 overlaps the point where the output_repout switches from the high level to the low level and thus, irrespective of the phase of the clock signal FFrep-clk deviating with respect to the switching point of the replica data_repda, sampling results of the third sampling circuit 150 are at an intermediate level.

On the other hand, since the third sampling circuit 150 samples the output_repout according to clock signals div-0 and div-90 of different phases, even if one of the clock signals overlaps with the switching point of the output_repout, the other signal can be made to not overlap the switching point of the output_repout.

Therefore, if the phase of the clock signal FFrep-clk deviates with respect to the switching point of the replica data_repda, at least one among the output_ph0 and the output_ph90 will be at the high level or the low level. Further, if the phase of the clock signal FFrep-clk does not deviate with respect to the switching point of the replica data_repda, both the output_ph0 and the output_ph90 will be at an intermediate level between the high level and the low level.

Therefore, for example, if the output_ph0 and the output_ph90 are at an intermediate level, the control circuit 160 does not change, but rather maintains the sampling timing of the first sampling circuit 120. Further, if at least one among the output_ph0 and the output_ph90 is at the high level or the low level, the control circuit 160 changes the sampling timing of the first sampling circuit 120, in which case, the control circuit 160 changes the sampling timing of the first sampling circuit 120, based on the output level of the output_ph0 or the output_ph90, whichever is high or low.

Further, the control circuit 160 may control the phase of each of the clock signals div-0 and div-90 such that at least one of the clock signals div-0 or div-90 (e.g., clock signal div-0) is at an intermediate level between the high level and the low level. As a result, the rising edge of the other clock signal div-0 or div-90 (e.g., clock signal div-90) can be made to not overlap with the switching point of the output_repout, and the control circuit 160 controls the sampling timing of the first sampling circuit 120, based on the level of the output_ph90.

Therefore, the control circuit 160 is able to prevent errant determination of a non-optimal timing point in the first sampling circuit 120 as the optimal point, thereby enabling assured compensation of the phase deviation of the clock signal FF-clk with respect to the optimal point of the serial data da and shaping of the serial data da with a high degree of accuracy.

Although the clock signals div-0 and div-90 have been described to be signals having, for example, a 90-degree phase difference, the phase difference of the clock signals div-0 and div-90 is not limited to 90 degrees and may be, for example, any value greater than 0 degrees and less than 180 degrees.

In other words, the phase difference of the clock signals div-0 and div-90 is set so that if the rising edge of one of the clock signals div-0 or div-90 overlaps the switching point of the output_repout, the rising edge of the other clock signal div-0 or div-90 does not overlap the switching point of the output_repout.

In this manner, the parallel-serial converter 100 according to the first embodiment samples the output_repout of the second sampling circuit 140 according to the clock signals div-0 and div-90 having respectively different phases, whereby a non-optimal timing point in the sampling by the first sampling circuit 120 is prevented from being errantly determined as the optimal point and deviation from the optimal point in the sampling by the first sampling circuit 120 can be detected with accuracy. Consequently, the serial data da can be shaped with a high degree of accuracy.

Figure 2:
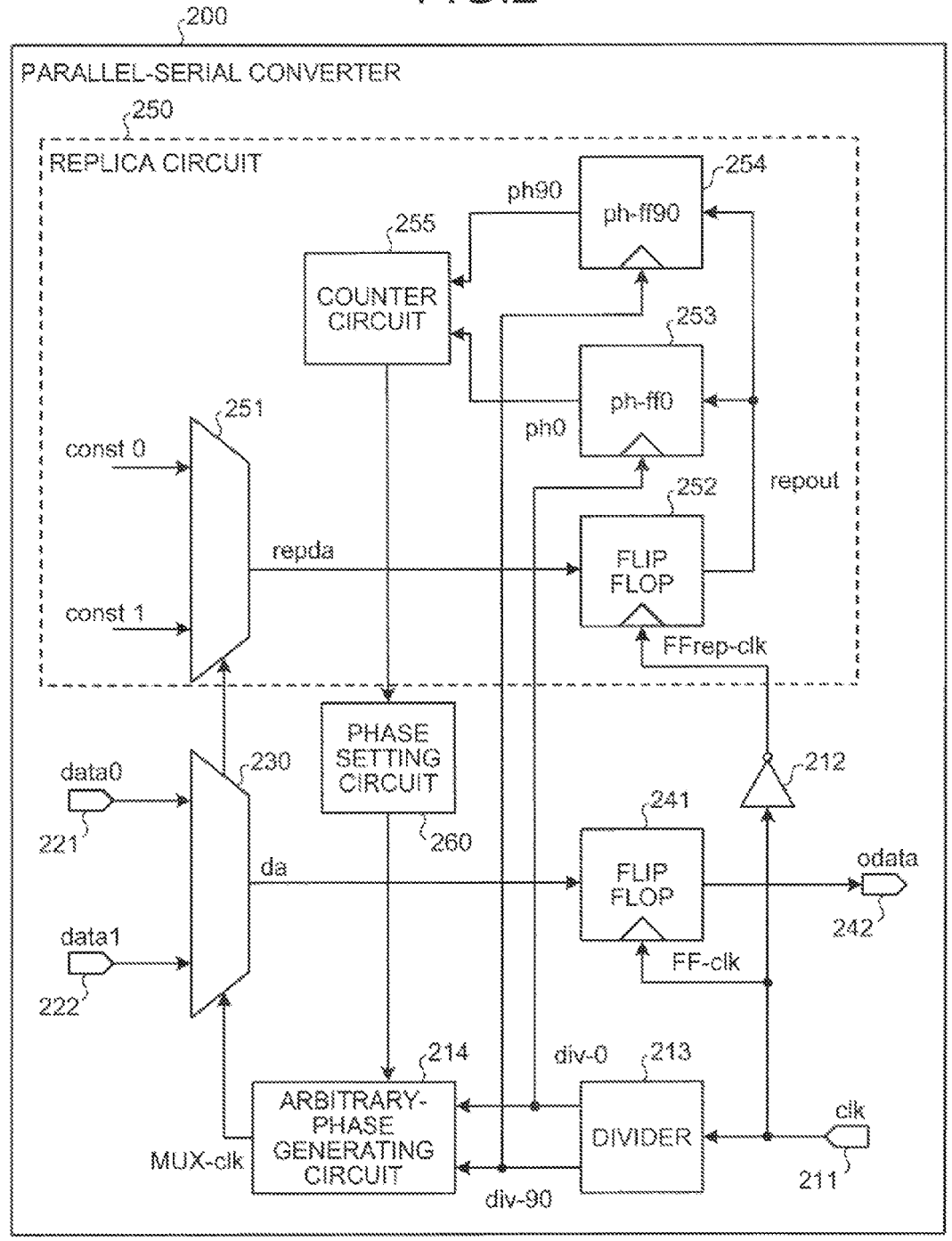
FIG. 2 depicts the parallel-serial converter according to a second embodiment.

FIG. 2 depicts the parallel-serial converter according to a second embodiment. As depicted in FIG. 2, a parallel-serial converter 200 includes an input terminal 211, an inverter circuit 212, a frequency dividing circuit 213 (divider), an arbitrary-phase generating circuit 214, input terminals 221 and 222, a converter circuit 230, a flip flop 241 (FF), an output terminal 242, a replica circuit 250, and a phase setting circuit 260.

The parallel-serial converter 200 converts the data0 and the data1 input as parallel data from the input terminal 221 and the input terminal 222 into data_odata (serial data) having a two-fold data rate and outputs the data_odata. The data_odata is, for example, supplied to a transmission circuit (not depicted) downstream from the parallel-serial converter 200, forming a data transmission system that includes the parallel-serial converter 200 and the transmission circuit.

A clock signal clk is input to the input terminal 211. The input terminal 211 outputs the clock signal clk to the inverter circuit 212, the frequency dividing circuit 213 and the flip flop 241. The inverter circuit 212 inverts the clock signal clk output from the input terminal 211 and outputs the inverted clock signal as a clock signal FFrep-clk, to the replica circuit 250.

The frequency dividing circuit 213 generates the clock signal div-0 and the clock signal div-90, each having half the frequency of the clock signal clk output from the input terminal 211 (the cycle is multiplied by an even multiple). The clock signal div-0 and the clock signal div-90 have a phase difference of 90 degrees. The frequency dividing circuit 213 outputs the generated clock signals div-0 and div-90 to the arbitrary-phase generating circuit 214 and the replica circuit 250.

The arbitrary-phase generating circuit 214 generates an arbitrary-phase frequency-divided clock signal from the clock signals div-0 and div-90 output from frequency dividing circuit 213. The arbitrary-phase generating circuit 214 changes the phase of the frequency-divided clock signal to be generated so that the phase becomes that set by the phase setting circuit 260. The arbitrary-phase generating circuit 214 outputs the generated frequency-divided clock signal as a clock signal MUX-clk, to the converter circuit 230 and a selector circuit 251 of the replica circuit 250.

The data0 is input to the input terminal 221, and the input terminal 221 outputs the data0 to the converter circuit 230. The data1 is input to the input terminal 222, and the input terminal 222 outputs the data1 to the converter circuit 230.

The converter circuit 230 corresponds to the converter circuit 110 depicted in FIG. 1. The converter circuit 230 selects and outputs one among the data0 and the data1 output from the input terminals 221 and 222. Further, the converter circuit 230, synchronized with the clock signal MUX-clk output from the arbitrary-phase generating circuit 214, switches the selection of data.

For example, the converter circuit 230, synchronized with the falling edge of the clock signal MUX-clk selects data0 and synchronized with the rising edge of the clock signal MUX-clk, selects data1. The converter circuit 230 outputs the selected data as serial data da, to the flip flop 241. Thus, the data0 and data1, which are parallel data, are converted into the serial data da.

The flip flop 241 corresponds to the first sampling circuit 120 depicted in FIG. 1. The clock signal clk output from the input terminal 211 (herein, regarded as the clock signal FF-clk) is supplied to the flip flop 241. The flip flop 241 performs retiming and waveform shaping by sampling, synchronized with the rising edge of the clock signal FF-clk, the serial data da output from the converter circuit 230. The flip flop 241 outputs data obtained from the sampling as data_odata, to the output terminal 242. The output terminal 242 outputs downstream, the data_odata output from the flip flop 241.

The replica circuit 250 includes the selector circuit 251, a flip flop 252 (flip flop), a flip flop 253 (ph-ff0), a flip flop 254 (ph-ff90), and a counter circuit 255.

The selector circuit 251 corresponds to the generating circuit 130 depicted in FIG. 1. Constant data "0" (const0) and constant data "1" (const1) are input to the selector circuit 251. The selector circuit 251 selects and outputs any among the constant data. Further, the selector circuit 251, synchronized with the data selection switching of the converter circuit 230, switches the selection of the constant data.

For example, the clock signal MUX-clk supplied to the converter circuit 230 is also supplied to the selector circuit 251. The selector circuit 251, synchronized with the clock signal MUX-clk, switches the selection of the constant data. Specifically, the selector circuit 251, synchronized with the falling edge of the clock signal MUX-clk, selects the constant data "0" and synchronized with the rising edge of the clock signal MUX-clk, selects the constant data "1". The selector circuit 251 outputs the selected constant data as the replica data_repda, to the flip flop 252.

The flip flop 252 corresponds to the second sampling circuit 140 depicted in FIG. 1. The flip flop 252, synchronized with the rising edge of the clock signal FFrep-clk output from the inverter circuit 212, samples the replica data_repda output from the selector circuit 251. The flip flop 252 outputs the sampling results as the output_repout, to the flip flops 253, 254, respectively.

The flip flop 253, synchronized with the rising edge of the clock signal div-0 output from the frequency dividing circuit 213, samples the output_repout output from the flip flop 252. The flip flop 253 outputs the sampling results as the output_ph0, to the counter circuit 255. The flip flop 254, synchronized with the rising edge of the clock signal div-90 output from the frequency dividing circuit 213, samples the output_repout output from the flip flop 252. The flip flop 254 outputs the sampling results as the output_ph90, to the counter circuit 255.

The output_ph0 and the output_ph90 respectively indicate the phase deviation of the rising edge of the clock signal FFrep-clk with respect to the switching point of the replica data_repda. For example, if the rising edge of the clock signal FF-clk is delayed relative to the optimal point of the serial data da, the rising edge of the clock signal FFrep-clk is delayed relative to the switching point of the replica data_repda. In this case, the output_ph0 and the output_ph90 are "1". Further, if the rising edge of the clock signal FF-clk is early relative to the optimal point of the serial data da, the rising edge of the clock signal FFrep-clk is early relative to the switching point of the replica data_repda. In this case, the output_ph0 and the output_ph90 are "0".

However, irrespective of the phase of the rising edge of the clock signal FFrep-clk deviating with respect to the switching point of the replica data_repda, the output_ph0 and the output_ph90 may indicate that there is no phase deviation among either. For example, if the rising edge of the clock signal div-0 overlaps the switching point of the output_repout, the output_ph0 is at an intermediate level, irrespective of the phase deviation of the rising edge of the clock signal FFrep-clk with respect to the switching point of the replica data_repda.

Further, if the rising edge of the clock signal div-90 overlaps the switching point of the output_repout, the output_ph90 is at an intermediate level, irrespective of the phase deviation of the rising edge of the clock signal FFrep-clk with respect to the switching point of the replica data_repda. However, since the clock signals div-0 and div-90 have a phase difference of 90 degrees, the rising edge of each of the clock signals div-0 and div-90 can be prevented from overlapping the switching point of the output_repout.

The counter circuit 255 and the phase setting circuit 260 correspond to, for example, the control circuit 160 depicted in FIG. 1. The counter circuit 255 counts the output_ph0 from the flip flop 253 and the output_ph90 from the flip flop 254. The counter circuit 255 outputs the count value indicated by the count results to the phase setting circuit 260.

The phase setting circuit 260, based on the count value output from the counter circuit 255, sets the phase of the clock signal MUX-clk to be generated by the arbitrary-phase generating circuit 214. For example, if the count value output from the counter circuit 255 has dropped, the phase setting circuit 260 advances the phase of the clock signal MUX-clk. Further, if the count value output from the counter circuit 255 has increased, the phase setting circuit 260 delays the phase of the clock signal MUX-clk.

Thus, the counter circuit 255 and the phase setting circuit 260 control the phase of the clock signal MUX-clk in a direction that reduces the phase deviation of the clock signal FFrep-clk with respect to the switching point of the replica data_repda. Further, the counter circuit 255 and the phase setting circuit 260, by controlling the phase of the clock signal FF-clk and the phase of the clock signal FFrep-clk, synchronized thereto, may control the relative phases of the serial data da and the clock signal FF-clk.

FIG. 3A is a timing chart for a case where the phase of the clock signal is delayed relative to the serial data. In FIG. 3A, reference numeral 301 represents the clock signal MUX-clk output from arbitrary-phase generating circuit 214 to the converter circuit 230; reference numeral 302 represents the serial data da output from the converter circuit 230 to the flip flop 241; and reference numeral 303 represents the clock signal FF-clk input to the flip flop 241.

Further, reference numeral 304 represents the replica data_repda output from the selector circuit 251 to the flip flop 252; reference numeral 305 represents the clock signal FFrep-clk input to the flip flop 252; reference numeral 306 represents the output_repout output from the flip flop 252; reference numeral 307 represents the clock signal div-0 input to the flip flop 253; and reference numeral 308 represents the output_ph0 output from the flip flop 253 to the counter circuit 255.

Here, a case will be described where as indicated by reference numerals 302 and 303, the phase of the rising edge of the clock signal FF-clk is delayed relative to the optimal point (e.g., a central point between switching points) of the serial data da. In this case, as indicated by reference numerals 304 and 305, the rising edge of the clock signal FFrep-clk is delayed relative to the switching point of the replica data_repda.

Thus, as indicated by reference numeral 306, the output_repout alternately switches between the high level and the low level. In this case, as indicated by reference numeral 308, the output_ph0 is constantly at the high level (all=1). Thus, the counter circuit 255 and the phase setting circuit 260 determine that the phase of the clock signal FF-clk is delayed (late) relative to the serial data da and delay the phase of the clock signal MUX-clk (reference numeral 311). As a result, the phase of the clock signal FF-clk for the serial data da becomes closer to the optimal point.

FIG. 3B is a timing chart for a case where the phase of the clock signal is early relative to the serial data. In FIG. 3B, components identical to those depicted in FIG. 3A are given the reference numerals used in FIG. 3A and description thereof is omitted.

Here, as indicated by reference numerals 302 and 303, a case will be described where the phase of the rising edge of the clock signal FF-clk is early relative to the optimal point of the serial data da. In this case, as indicated by reference numerals 304 and 305, the rising edge of the clock signal FFrep-clk is early relative to the switching point of the replica data_repda.

Therefore, as indicated by reference numeral 306, the output_repout alternately switches between the high level and the low level. However, compared to the case depicted in FIG. 3A, the phase of the output_repout is different by 180 degrees and therefore, as indicated by reference numeral 308, the output_ph0 is constantly at the low level (all=0). Thus, the counter circuit 255 and the phase setting circuit 260 determine that the phase of the clock signal FF-clk is too soon (early) relative to the serial data da and advance the clock signal MUX-clk (reference numeral 321). As a result, the phase of the clock signal FF-clk for the serial data da becomes closer to the optimal point.

FIG. 3C is a timing chart for a case where with respect to the serial data, the phase of the clock signal coincides with the optimal point. In FIG. 3C, components identical to those depicted in FIG. 3A are given the same reference numerals used in FIG. 3A and description thereof is omitted.

Here, as indicated by reference numerals 302 and 303, a case where the rising edge of the clock signal FF-clk coincides with the optimal point of the serial data da will be described. In this case, as indicated by reference numerals 304 and 305, the rising edge of the clock signal FFrep-clk coincides with the switching point of the replica data_repda.

Therefore, as indicated by reference numeral 306, the output_repout is at an intermediate level between the level and the low level, an indeterminate value. Hence, as indicated by reference numeral 308, the output_ph0 is constantly at an intermediate level. Thus, the counter circuit 255 and the phase setting circuit 260 determine that the phase of the clock signal FF-clk coincides with the optimal point with respect to the serial data da and maintain the phase of the clock signal MUX-clk (reference numeral 331). As a result, the phase of the clock signal FF-clk for the serial data da is stable at the optimal point.

Figure 4:
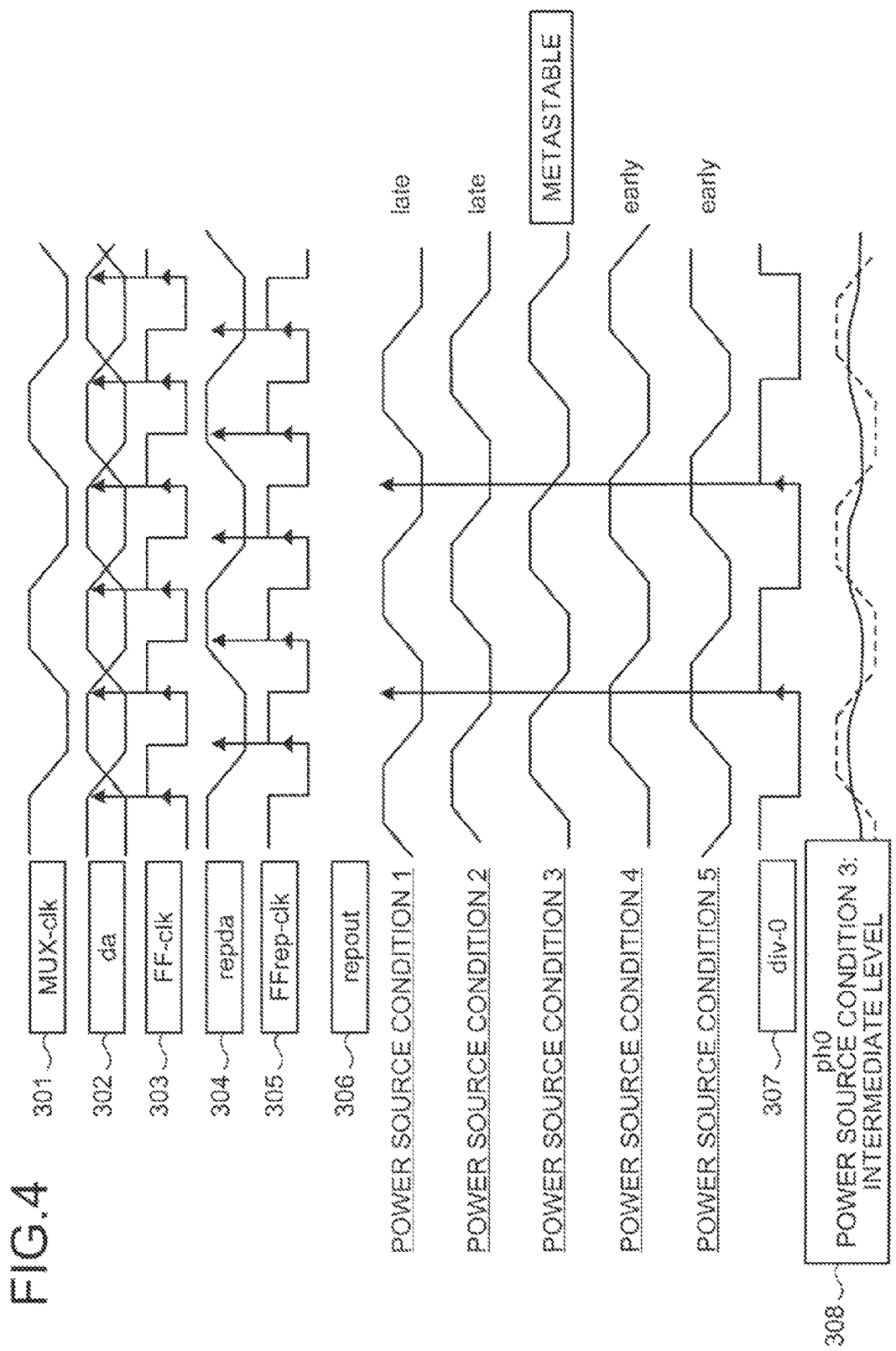
FIG. 4 is a timing chart for a case where flip flop output is dependent on source voltage.

FIG. 4 is a timing chart for a case where flip flop output is dependent on source voltage. In FIG. 4, components identical to those depicted in FIG. 3A are given the same reference numerals used in FIG. 3A and description thereof is omitted. Here, as indicated by reference numerals 302 and 303, a case will be described where the rising edge of the clock signal FF-clk is delayed relative to the optimal point of the serial data da. As indicated by reference numeral 306 in FIG. 4, the phase of the output_repout from the flip flop 252 changes according to power source conditions 1 to 5.

For example, in the case of power source condition 3, the switching point of the output_repout and the rising edge of the clock signal div-0 overlap. Therefore, as indicated by reference numeral 308, irrespective of the rising edge of clock signal FF-clk deviating from the optimal point of the serial data da, the output_ph0 is at an intermediate level (metastability). In this case, a state occurs identical to that when the rising edge of the clock signal FF-clk coincides with the optimal point of the serial data da. Further, the phase of the output_repout also changes according other environmental conditions, such as temperature.

FIG. 5A is a first diagram depicting how errant determination is prevented by the clock signals having different phases. In FIG. 5A, components identical to those depicted in FIG. 3A are given the same reference numerals used in FIG. 3A and description thereof is omitted. Here, as indicated by reference numerals 302 and 303, a case will be described where the rising edge of the clock signal FF-clk is delayed relative to the optimal point of the serial data da. As indicated by reference numeral 501 in FIG. 5A, in addition to the clock signal div-0, the clock signal div-90 is used to perform sampling in the parallel-serial converter 200. Here, as with the power source condition 3 depicted in FIG. 4, the rising edge of the clock signal div-0 overlaps the switching point of the output_repout and the output_ph0 is at an intermediate level.

Thus, since the clock signal div-90 and the clock signal div-0 have a 90 degree phase difference, the rising edge of the clock signal div-90 does not overlap the switching point of the output_repout. Therefore, as indicated by reference numeral 502, the output_ph90 is constantly at the low level (all=0). As a result, the counter circuit 255 and the phase setting circuit 260 determine that the clock signal FF-clk is delayed relative to the optimal point of the serial data da, and delay the clock signal MUX-clk.

FIG. 5B is a second diagram depicting how errant determination is prevented by the clock signals having different phases. In FIG. 5B, components identical to those depicted in FIG. 5A are given the same reference numerals used in FIG. 5A and description thereof is omitted. Here, as indicated by reference numerals 302 and 303, a case is described where the rising edge of the clock signal FF-clk coincides with the optimal point of the serial data da. In this case, as indicated by reference numeral 308 and 502 in FIG. 5B, both the output_ph0 and the output_ph90 are at intermediate levels. As a result, the counter circuit 255 and the phase setting circuit 260 determine that the phase of the clock signal FF-clk is at the optimal point with respect to the optimal point of the serial data da, and maintain the clock signal MUX-clk.

Figure 6:
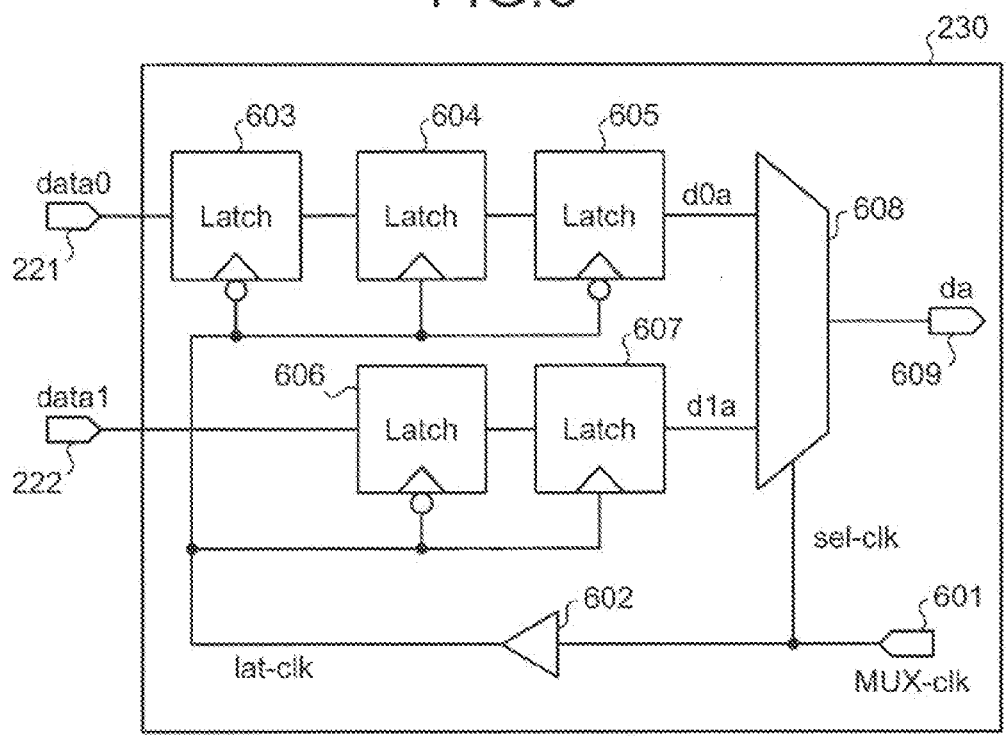
FIG. 6 depicts an example of a converter circuit depicted in FIG. 2.

FIG. 6 depicts an example of the converter circuit depicted in FIG. 2. In FIG. 6, components identical to those depicted in FIG. 2 are given the same reference numerals used in FIG. 2 and description thereof is omitted. As depicted in FIG. 6, the converter circuit 230 includes an input terminal 601, a delay buffer 602, latch circuits 603 to 607, a selector circuit 608, and an output terminal 609.

The clock signal MUX-clk output from the arbitrary-phase generating circuit 214 is input to the input terminal 601. The input terminal 601 outputs the clock signal MUX-clk to the delay buffer 602 and the selector circuit 608. The delay buffer 602 delays the clock signal MUX-clk from the input terminal 601 and outputs the delayed clock signal as clock signal lat-clk, to the latch circuits 603 to 607.

The clock signal lat-clk output from the delay buffer 602 is input to the latch circuits 604 and 607, while the clock signal lat-clk output from the delay buffer 602 is inverted and then input to the latch circuits 603, 605, and 606.

The input terminal 221 receives input of the data0 and outputs the data0 to the latch circuit 603. The data0 input to the latch circuit 603 are sequentially latched by the latch circuits 603 to 605, according to the clock signal lat-clk. The data0 sequentially latched by the latch circuits 603 to 605 are delayed by 1 cycle of the clock signal MUX-clk and output as data_d0a to the selector circuit 608.

The input terminal 222 receives input of the data1 and outputs the data1 to the latch circuit 606. The data1 input to the latch circuit 606 is sequentially latched by the latch circuits 606 and 607, according to the clock signal lat-clk. The data1 sequentially latched by latch circuits 606 and 607 is delayed by a half cycle of the clock signal MUX-clk and output as data_d1a to the selector circuit 608. Therefore, the data_d0a and the data_d1a input to the selector circuit 608 have a phase difference of 180 degrees.

The clock signal MUX-clk output from the input terminal 601 is input to the selector circuit 608 as a clock signal sel-clk. The selector circuit 608, synchronized with the falling edge of the clock signal sel-clk, outputs the data_d0a to the output terminal 609; and synchronized with the rising edge of the clock signal sel-clk, outputs the data_d1a to the output terminal 609. The output terminal 609 outputs, as serial data da and to the flip flop 241, the data_d0a and the data_d1a alternately output from the selector circuit 608.

Figure 7:
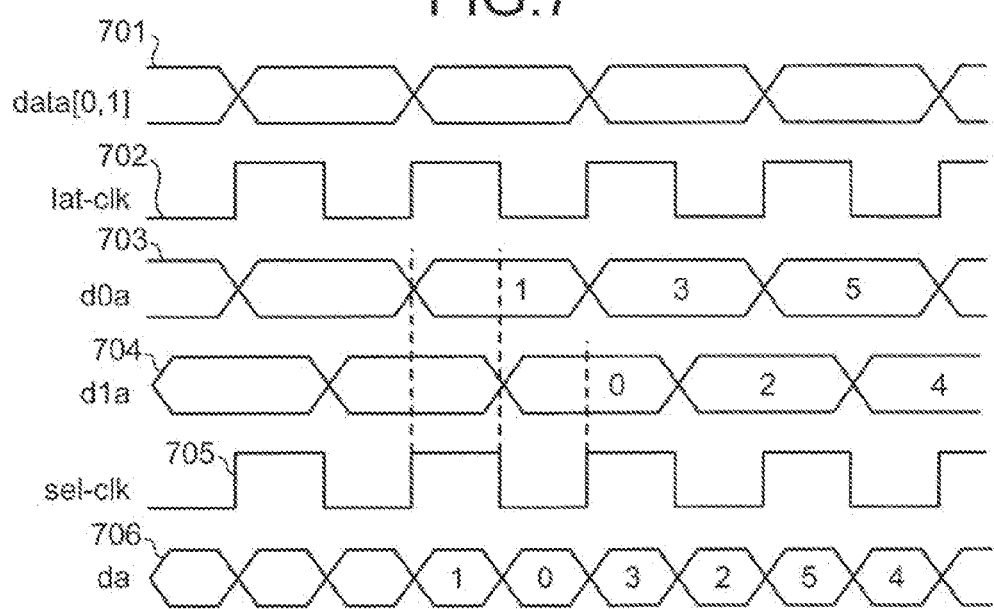
FIG. 7 is timing chart of the converter circuit depicted in FIG. 6.

FIG. 7 is timing chart of the converter circuit depicted in FIG. 6. In FIG. 7, reference numeral 701 represents the data0 and the data1 input to the input terminals 221 and 222; reference numeral 702 represents the clock signal lat-clk output from the latch circuits 603 to 607; reference numeral 703 represents the data_d0a input to the selector circuit 608; and reference numeral 704 represents the data_d1a input to the selector circuit 608. "1", "3", "5", . . . of the data_d0a represent sections of the data_d0a and "0", "2", "4", . . . of the data_d1a represent sections of the data_d1a.

Reference numeral 705 represents the clock signal sel-clk input to the selector circuit 608. Reference numeral 706 represents the serial data da output from the output terminal 609. As indicated by reference numerals 701 to 704, the data0 and the data1 of a 180-degree difference are input as the data_d0a and the data_d1a to the selector circuit 608. Further, as indicated by reference numerals 705 and 706, at the falling edge sections of the clock signal sel-clk, the data_d0a is output, while at the rising edge sections of the clock signal sel-clk, the data_d1a is output.

Therefore, the serial data da becomes serial data arranged in the sequence of section "1" having the data_d0a, section "0" having the data_d1a, section "3" having the data_d0a, section "2" having the data_d1a, section "5" having the data_d0a, and section "4" having the data_d1a.

Figure 8:
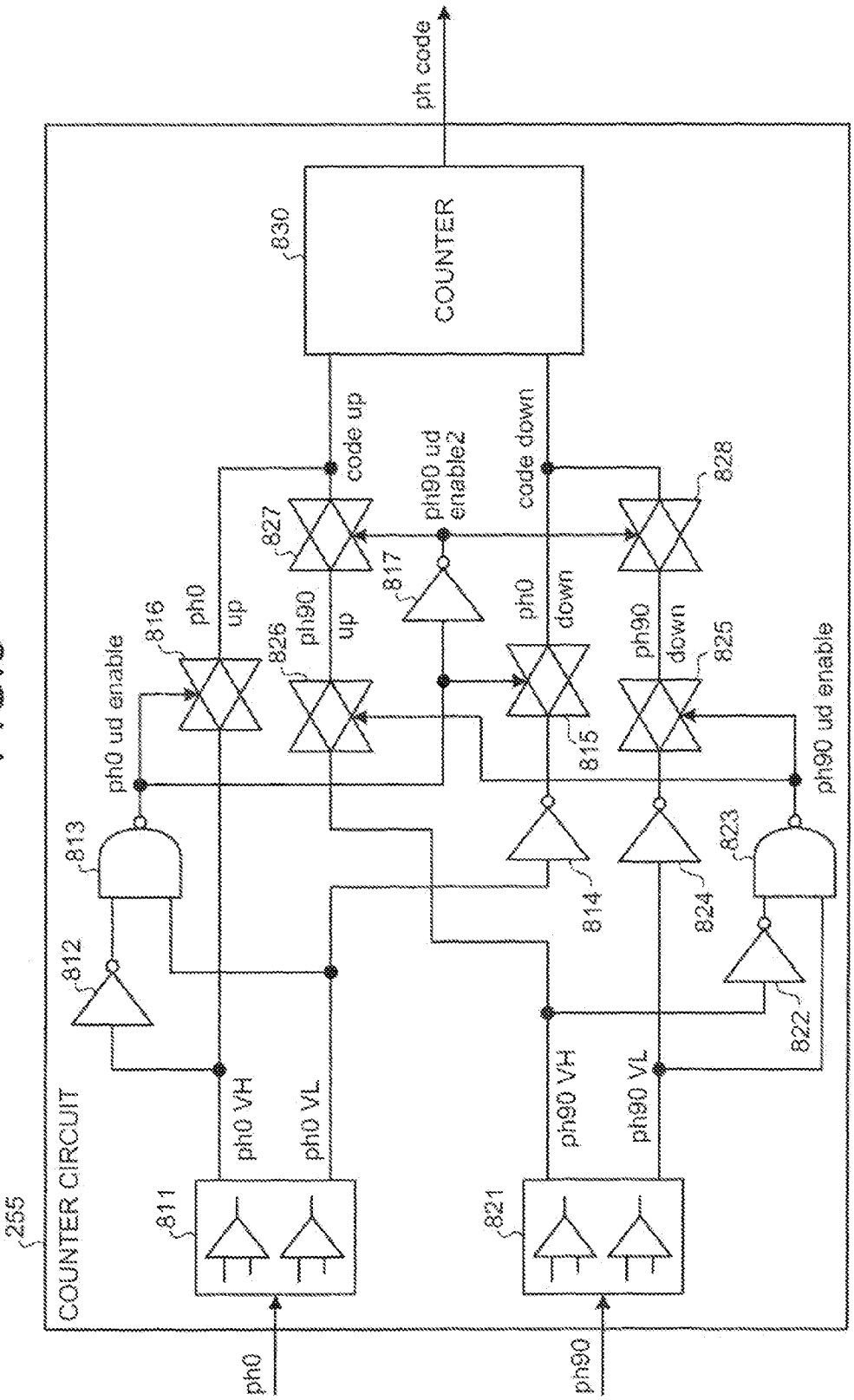
FIG. 8 depicts an example of a counter circuit depicted in FIG. 2.

FIG. 8 depicts an example of the counter circuit depicted in FIG. 2. As depicted in FIG. 8, the counter circuit 255 includes a level detector circuit 811, an inverter circuit 812, an exclusive OR circuit 813, an inverter circuit 814, a switch 815, a switch 816, an inverter circuit 817, a level detector circuit 821, an inverter circuit 822, an exclusive OR circuit 823, an inverter circuit 824, a switch 825, a switch 826, a switch 827, a switch 828, and a counter 830.

The output_ph0 from flip flop 253 is input to the level detector circuit 811. The level detector circuit 811 determines whether the output_ph0 is at the high level, low level, or an intermediate level. The level detector circuit 811 has output_ph0 VH and output_ph0 VL. The output_ph0 VH of the level detector circuit 811 is input to the inverter circuit 812 and the switch 816. The output_ph0 VL of the level detector circuit 811 is input to the exclusive OR circuit 813 and the inverter circuit 814.

The level detector circuit 811 makes the output_ph0 VH and the output_ph0 VL "high", if the output_ph0 is at the high level. Further, the level detector circuit 811 makes the output_ph0 VH and the output_ph0 VL "low", if the output_ph0 is at the low level. The level detector circuit 811 makes the output_ph0 VH "low" and makes the output_ph0 VL "high", if the output_ph0 is at an intermediate level.

The inverter circuit 812 inverts and outputs to the exclusive OR circuit 813, the output_ph0 VH from the level detector circuit 811. The exclusive OR circuit 813 outputs the exclusive OR of the output_ph0 VL from the level detector circuit 811 and the output of the inverter circuit 812. The output_ph0 ud enable of the exclusive OR circuit 813 is input to the switch 816, the switch 815, and the inverter circuit 817.

The inverter circuit 814 inverts and outputs to the switch 815, the output_ph0 VL from the level detector circuit 811. The switch 815 turns the output from the inverter circuit 814 off and on according to the output_ph0 ud enable from the exclusive OR circuit 813. The output_ph0 down of the switch 815 is output to the counter 830. The inverter circuit 817 inverts the output_ph0 ud enable from the exclusive OR circuit 813 and outputs the inverted output_ph0 ud enable as output_ph90 ud enable2 to the switch 827 and the switch 828.

The switch 816 turns the output_ph0 VH from the level detector circuit 811 off and on according to the output_ph0 ud enable from the exclusive OR circuit 813. The output_ph0 up of the switch 816 is connected between the switch 827 and the counter 830.

The output_ph90 from the flip flop 254 is input to the level detector circuit 821. The level detector circuit 821 determines whether the output_ph90 is at the high level, low level, or an intermediate level. The level detector circuit 821 has output_ph90 VH and output_ph90 VL. The output_ph90 VH is input to the inverter circuit 822 and the switch 826. The output_ph90 VL is input to the exclusive OR circuit 823 and the inverter circuit 824.

The level detector circuit 821 makes the output_ph90 VH and the output_ph90 VL "high", if the output_ph90 is at the high level. The level detector circuit 821 makes the output_ph90 VH and the output_ph90 VL "low", if the output_ph90 is at the low level. Further, the level detector circuit 821 makes the output_ph90 VH "low" and makes the output_ph90 VL "high", if the output_ph90 is at an intermediate level.

The inverter circuit 822 inverts and outputs to the exclusive OR circuit 823, the output_ph90 VH from the level detector circuit 821. The exclusive OR circuit 823 outputs the exclusive OR of the output_ph90 VL from the level detector circuit 821 and the output of the inverter circuit 822. The output_ph90 ud enable of the exclusive OR circuit 823 is input to the switch 826 and the switch 825.

The inverter circuit 824 inverts and outputs to the switch 825, the output_ph90 VL from the level detector circuit 821. The switch 825 turns the output from the inverter circuit 824 off and on according to the output_ph90 ud enable from the exclusive OR circuit 823. The output_ph90 down of the switch 825 is input to the switch 828.

The switch 826 turns the output_ph90 VH from the level detector circuit 821 off and on according to the output_ph90 ud enable from the exclusive OR circuit 823. The output_ph90 up of the switch 826 is input to the switch 827.

The switch 827 turns the output_ph90 up from the switch 826 off and on according to the output_ph90 ud enable2 from the inverter circuit 817. A signal selected according to the ph90 ud enable2 and from among the output_ph0 up from the switch 816 and the output_ph90 up from the switch 827 is input to the counter 830 as a count-up signal_code up.

The switch 828 turns the output_ph90 down from the switch 825 off and on according to the output_ph90 ud enable2 from the inverter circuit 817. A signal selected according to ph90 ud enable2 and from among the output_ph0 down from the switch 815 and the output_ph90 down from the switch 825 is input to the counter 830 as a count-down signal_code down.

If the count-up signal_code up is input, the counter 830 increments the count value, whereas, if the count-down signal_code down is input, the counter 830 decrements the count value. Further, the counter 830 maintains the count value when neither the count-up signal_code up nor the count-down signal_code down is input. The counter 830 outputs a code_ph code indicative of the count value to the phase setting circuit 260. The phase setting circuit 260, based on the code_ph code output from the counter 830, sets the phase of the clock signal MUX-clk to be generated by the arbitrary-phase generating circuit 214.

FIG. 9 depicts operation of the counter circuit depicted in FIG. 8. Table 900 depicted in FIG. 9 is a truth table of the counter circuit 255 depicted in FIG. 8. As depicted in table 900, the output_ph0 ud enable of the exclusive OR circuit 813 is "1" if the output_ph0 is at the high level (High) or at the low level (Low), and is "0" if the output_ph0 is at an intermediate level.

The output_ph0 up of the switch 816 is "0" if the output_ph0 is at the low level, is "1" of the output_ph0 is at the high level, and off (off) is the output_ph0 is at an intermediate level. The output_ph0 down of the switch 815 is "1" if the output_ph0 is at the low level, is "0" if the output_ph0 is at the high level, and is off (off) if the output_ph0 is at an intermediate level.

The output_ph90 ud enable of the exclusive OR circuit 82 is "1" if the output_ph90 is at the high level or at the low level, is "0" if the output_ph90 is at an intermediate level. The output_ph90 up of the switch 826 is "0" if the output_ph90 is at the low level, is "1" if the output_ph90 is at the high level, and is off (off) if the output_ph90 is at an intermediate level. The output_ph90 down of the switch 825 is "1" if the output_ph90 is at the low level, is "0" if the output_ph90 is at the high level, and is off (off) if the output_ph90 is at an intermediate level.

The output_ph90 ud enable2 from the inverter circuit 817 is "0" if the output_ph0 is at the high level (High) or at the low level (Low) and is "1" if the output_ph0 is at an intermediate level. The code up-down input to the counter 830 is code down (down) if the output_ph0 is at the low level and the output_ph90 is at an intermediate level. Further, the input code up-down is code up (up) if the output_ph0 is at the high level and the output_ph90 is at an intermediate level.

The input code up-down is the code down (down) if the output_ph0 is at an intermediate level and the output_ph90 is at the low level. The input code up-down is the code up (up) if the output_ph0 is at an intermediate level and the output_ph90 at the high level. The input code up-down is optimally fixed if the output_ph0 and the output_ph90 are both at an intermediate level.

Thus, the counter circuit 255 maintains the count value if the output_ph0 and the output_ph90 are both at an intermediate level. Further, the counter 830 decrements the count value if the output_ph0 is at the low level and increments the count value if the output_ph0 is at the high level. The counter 830 decrements the count value if the output_ph0 is at an intermediate level and the output_ph90 is at the low level. Further, the counter 830 increments the count value if the output_ph0 is at an intermediate value and the output_ph90 is at the high value.

As a result, if the output_ph0 and the output_ph90 are at an intermediate level, the sampling timing of the flip flop 252 can be maintained without change. Further, if at least one among the output_ph0 and the output_ph90 is at the high level or at the low level, the sampling timing of the flip flop 252 can be changed. Specifically, the sampling timing of the flip flop 252 can be changed based on the high level or the low level of the output_ph0 or the output_ph90.

However, if one of the output (the output_ph0 or the output_ph90) is at the high level and the other output (output_ph0 or the output_ph90I is at the low level, the direction in which the sampling timing of the flip flop 252 is changed is determined based on whichever (the output_ph0 or the output_ph90a) has been predetermined to take priority. In the example depicted in table 900, the output_ph0 has a higher priority than the output_ph90 and therefore, the count value is determined preferentially using the output_ph0.

FIG. 10 depicts an example of the level detector circuit depicted in FIG. 9. As depicted in FIG. 10, the level detector circuit 811 includes a comparator 1011 and a comparator 1012. The output_ph0 input to the level detector circuit 811 and a threshold VThigh are input to the comparator 1011. The comparator 1011 outputs "high" as output VHout if the output_ph0 exceeds the threshold VThigh. Further, the comparator 1011 outputs "low" as the output VHout if the output_ph0 is equal to or less than the threshold VThigh.

The output_ph0 input to the level detector circuit 811 and a threshold VTlow are input to the comparator 1012. The comparator 1012 outputs "high" as output VLout if the output_ph0 is equal to or greater than the threshold VTlow, and outputs "low" as the output VLout if the output_ph0 is less than the threshold VTlow. The output VHout from the comparator 1011 is output downstream as the output_ph0 VH. The output VLout from the comparator 1011 is output downstream as the output_ph0 VL.

Although an example of the level detector circuit 811 has been described herein, the example is applicable to the level detector circuit 821. In this case, the output_ph90 instead of the output_ph0 is input to the comparator 1011 and the comparator 1012. Further, the output VHout from the level detector circuit 821 is output downstream as the output_ph90 VH; and the output VLout from the comparator 1012 is output downstream as the output_ph90 VL.

FIG. 11 depicts an example of setting the threshold of the level detector circuit depicted in FIG. 10. Reference numeral 1101 represents the output_ph0 when, for example, the clock signal FFrep-clk is delayed relative to replica data_repda. Reference numeral 1102 represents the output_ph0, for example, when the clock signal FFrep-clk is early relative to the replica data_repda. Reference numeral 1103 represents the output_ph0 when, for example, the phase of the clock signal FFrep-clk is at the optimal point with respect to the replica data_repda.

The threshold VThigh in the level detector circuit 811 is set lower than the output_ph0 (high level of replica data_repda) indicated by reference numeral 1101 and is set higher than the greatest value of the output_ph0 indicated by reference numeral 1103. The threshold VTlow in the level detector circuit 811 is set higher than the output_ph0 (low level of replica data_repda) indicated by reference numeral 1102 and is set lower than the lowest value of the output_ph0 indicated by reference numeral 1103. Although an example of the level detector circuit 811 has been described herein, the example is similarly applicable to the level detector circuit 821.

FIG. 12 depicts an example of level determination by the level detector circuit depicted in FIG. 10. Table 1200 depicted in FIG. 12 depicts criteria for determining the level of the output_ph0, which is based on the output VHout and the output VLout from the level detector circuit 811.

Specifically, if the output VHout is "high" and the output VLout is "high", the level of the output_ph0 is determined to be at a high level (high). If the output VHout is "low" and the output VLout is "high", the level of the output_ph0 is determined to be at an intermediate level. If the output VHout is "low" and the output VLout is "low", the level of the output_ph0 is determined to be at the low level (low).

Thus, the level detector circuit 811 can determine whether the output_ph0 input thereto is at the high level, the low level, or an intermediate level. Although an example has been described herein for the level detector circuit 811, the example is similarly applicable to the level detector circuit 821.

In this manner, the parallel-serial converter 200 according to the second embodiment samples the output_repout of the flip flop 252 according to the clock signals div-0 and div-90 having respectively different phases. The parallel-serial converter 200 does not change, but rather maintains the sampling timing of the flip flop 241 if the output_ph0 and the output_ph90 are at an intermediate level.

Further, the parallel-serial converter 200 changes the sampling timing of the flip flop 241 if either the output_ph0 or the output_ph90 is at the high level or the low level. As a result, a non-optimal point in the sampling timing of the flip flop 24 can be prevented from being errantly determined as the optimal point. Therefore, phase deviation of the clock signal FF-clk with respect to the optimal point of the serial data da can be assuredly compensated and the serial data da can be shaped with a high degree of accuracy.

Figure 13:
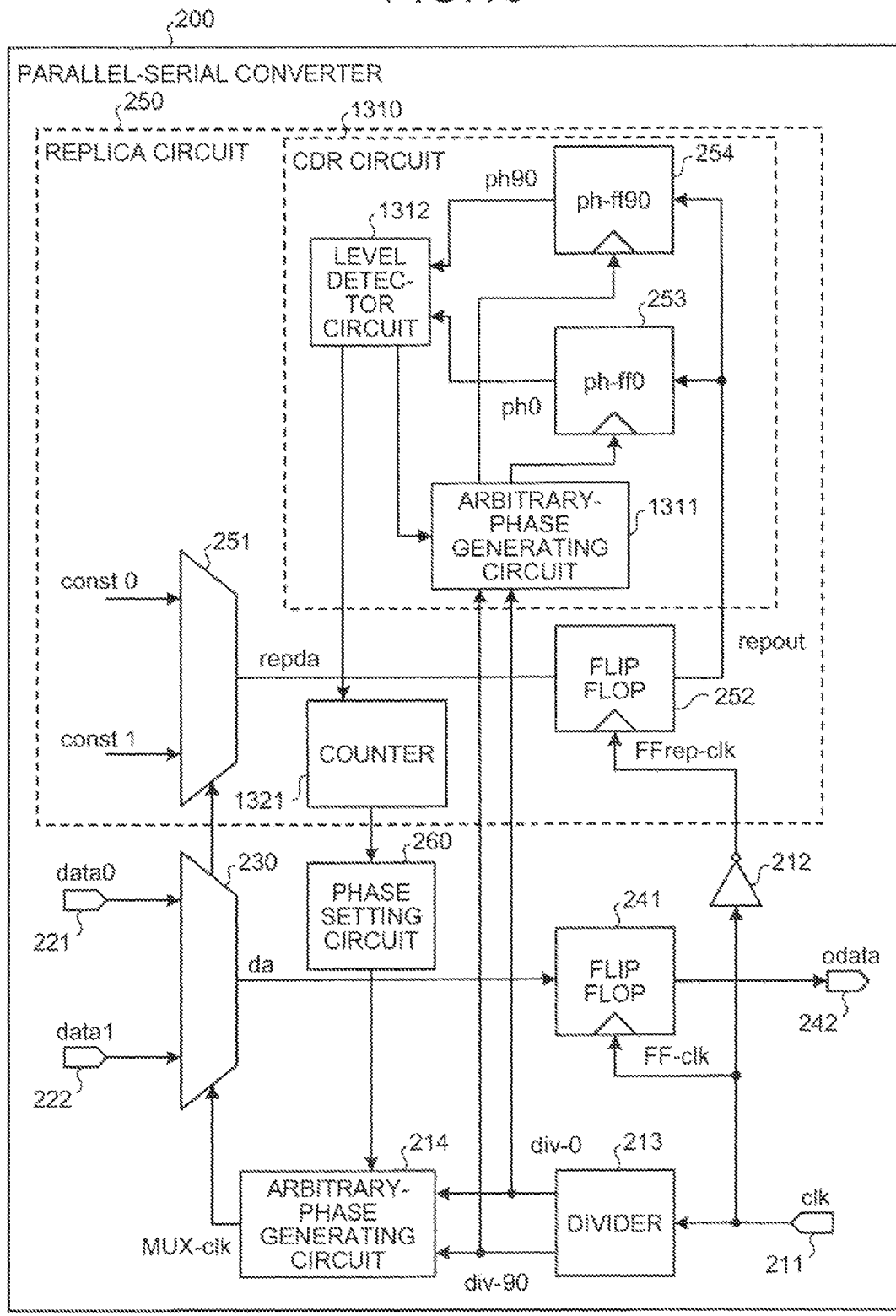
FIG. 13 depicts the parallel-serial converter according to a third embodiment.

FIG. 13 depicts the parallel-serial converter according to a third embodiment. In FIG. 13, components identical to those depicted in FIG. 2 are given the same reference numerals used in FIG. 2 and description thereof is omitted. As depicted in FIG. 13, the parallel-serial converter 200 includes the input terminal 211, the inverter circuit 212, the frequency dividing circuit 213, the arbitrary-phase generating circuit 214, the input terminals 221 and 222, the converter circuit 230, the flip flop 241, the output terminal 242, the replica circuit 250, a counter 1321, and the phase setting circuit 260.

The replica circuit 250 includes a clock data recovery (CDR) circuit 1310. Here, the counter circuit 255 depicted in FIG. 2 may be omitted. The CDR circuit 1310 includes the flip flops 253 and 254, an arbitrary-phase generating circuit 1311, and the level detector circuit 1312. The clock signals div-0 and div-90 output from the frequency dividing circuit 213 are input to the arbitrary-phase generating circuit 1311.

The arbitrary-phase generating circuit 1311 generates clock signals div-0 and div-90 that are the clock signals div-0 and div-90 input thereto and whose phases have been changed. The clock signals div-0 and div-90 generated by the arbitrary-phase generating circuit 1311 are, for example, clock signals having a phase difference of 90 degrees.

The arbitrary-phase generating circuit 1311, for example, changes the phase of the clock signal div-0 to be generated such that the level of the output_ph0 to be output from the level detector circuit 1312 is at an intermediate level. The arbitrary-phase generating circuit 1311 outputs the generated clock signal div-0 to the flip flop 253 and outputs the generated clock signal div-90 to the flip flop 254.

The level detector circuit 1312 detects and outputs to the arbitrary-phase generating circuit 1311, the level of the output_ph0 from the flip flop 253. Further, the level detector circuit 1312 detects and outputs to the counter 1321, the level of the output_ph90 from the flip flop 254. The counter 1321 increments the count value if the high level is output from the level detector circuit 1312, decrements the count value if the low level is output, and maintains the count value if an intermediate level is output.

Although, a configuration has been described herein where the level detector circuit 1312 outputs the level of the output_ph0 to the arbitrary-phase generating circuit 1311, the level detector circuit 1312 may output the level of the output_ph90 to the arbitrary-phase generating circuit 1311. In this case, the level detector circuit 1312 outputs the level of the output_ph0 to the counter 1321. Further, the arbitrary-phase generating circuit 1311 changes the phase of the clock signal div-90 to be generated such that the level of the output_ph90 to be output from the level detector circuit 1312 is at an intermediate level.

Although a configuration has been described herein where the output_repout is sampled according to 2 clock signals, the clock signals div-0 and div-90, the output_repout may be sampled according to 3 or more clock signals of respectively different phases. In this case, the arbitrary-phase generating circuit 1311 changes the phase of the clock signal div-90 to be generated such that any of the output sampled according to the 3 or more clock signals is at an intermediate level.

Figure 14A:
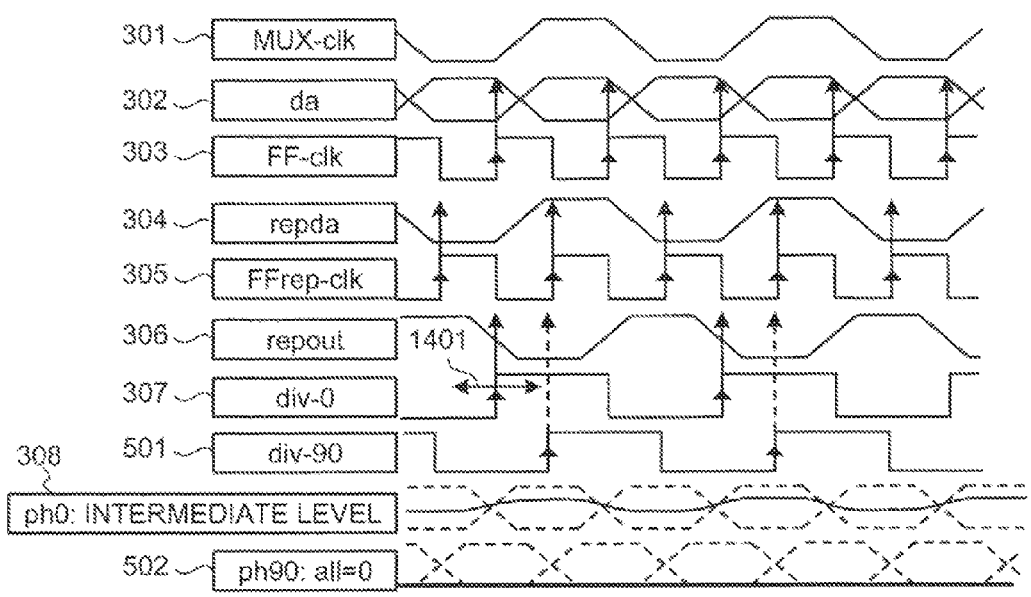
FIG. 14A is a first diagram depicting how errant determination is prevented by clock signals having different phases.

FIG. 14A is a first diagram depicting how errant determination is prevented by the clock signals having different phases. In FIG. 14A, components identical to those in FIG. 5A are given the same reference numerals used in FIG. 5A and description thereof is omitted. Here, a case is described where, as indicated by reference numerals 302 and 303, the phase of the rising edge of the clock signal FF-clk is delayed relative to the optimal point of the serial data da.

As indicated by reference numeral 308, the arbitrary-phase generating circuit 1311 changes the phase of the clock signal div-0 (reference numeral 1401) to be generated such that the output_ph0 is at an intermediate level. As a result, as indicated by reference numerals 306 and 501, the rising edge of the clock signal div-90 can be made to not overlap the switching point of the output_repout, whereby the output_ph90 is constantly at the low level (all=0). Thus, the counter circuit 255 and the phase setting circuit 260 determine that the clock signal FF-clk is delayed with respect to the optimal point of the serial data da and delay the phase of the clock signal MUX-clk.

Figure 14B:
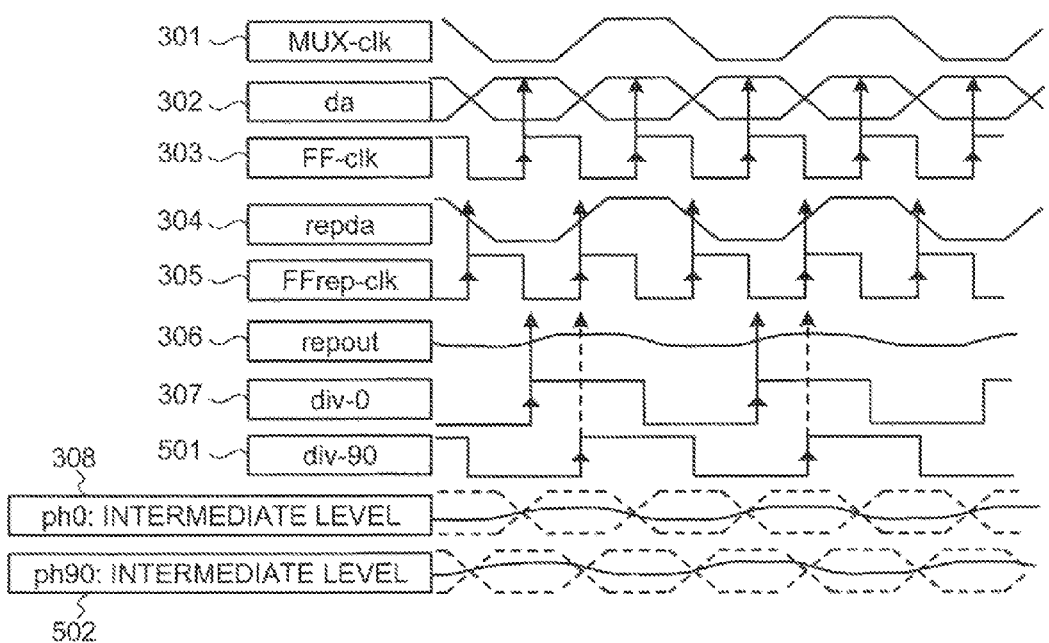
FIG. 14B is a second diagram depicting how errant determination is prevented by clock signals having different phases.

FIG. 14B is a second diagram depicting how errant determination is prevented by the clock signals having different phases. In FIG. 14B, components identical to those depicted in FIG. 14A are given the same reference numerals used in FIG. 14A and description thereof is omitted. Here, a case is described, where as indicated by reference numerals 302 and 303, the rising edge of the clock signal FF-clk coincides with the optimal point of the serial data da.

In this case, as indicated by reference numerals 308 and 502 in FIG. 14B, both the output_ph0 and the output_ph90 are at an intermediate level. As a result, the counter circuit 255 and the phase setting circuit 260 determine that the phase of the clock signal FF-clk is at the optimal point with respect to the optimal point of the serial data da and maintain the clock signal MUX-clk.

In this manner, the parallel-serial converter 200 according to the third embodiment samples the output_repout of the flip flop 252 according to the clock signals div-0 and div-90 respectively having different phases. Additionally, the parallel-serial converter 200 controls the phase of the clock signals div-0 and div-90 so that the sampling signal ph0 is at an intermediate level between the high level and the low level. As a result, the rising edge of the clock signal div-90 can be made to not overlap the switching point of the output_repout.

Furthermore, the parallel-serial converter 200 controls the sampling timing of the flip flop 241, based on the level of the output_ph90. As a result, a non-optimal point in the sampling timing can be prevented from being errantly determined as the optimal point, and phase deviation of the clock signal FF-clk with respect to the optimal point of the serial data da can be assuredly compensated. Therefore, the serial data da can be shaped with a high degree of accuracy.

As described the parallel-serial converter enables serial data to be shaped with a high degree of accuracy.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A parallel-serial converter comprising:
a converter circuit that converts parallel data into serial data;
a first sampling circuit that samples, according to a first clock signal, the serial data output from the converter circuit;
a second sampling circuit that samples, according to a second clock signal that is an inverse of the first clock signal, replica data that is synchronized with the serial data;
a third sampling circuit that samples, according to plural third signals respectively having different phases, output from the second sampling circuit; and
a control circuit that controls sampling timing of the first sampling circuit, based on each output from the third sampling circuit.

2. The parallel-serial converter according to claim 1, wherein each of the third clock signals has a cycle that is an even multiple of the cycle of the first clock signal.

3. The parallel-serial converter according to claim 1, wherein the control circuit maintains the sampling timing if each of the output from the third sampling circuit is at an intermediate level between a high level and a low level, and changes the sampling timing if any of the output from the third sampling unit is at the high level or at the low level.

4. The parallel-serial converter according to claim 3, wherein the control circuit changes the sampling timing, based on the output that is at the high level or the low level.

5. The parallel-serial converter according to claim 1, wherein the control circuit controls the phase of each of the third clock signals such that at least one of the third clock signals is at the intermediate level.

* * * * *